United States Patent
Beitelmal et al.

(10) Patent No.: US 6,904,968 B2
(45) Date of Patent: *Jun. 14, 2005

(54) METHOD AND APPARATUS FOR INDIVIDUALLY COOLING COMPONENTS OF ELECTRONIC SYSTEMS

(75) Inventors: Abdlmonem H. Beitelmal, Sacramento, CA (US); Chandrakant D. Patel, Fremont, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/951,730

(22) Filed: Sep. 14, 2001

(65) Prior Publication Data

US 2003/0053293 A1 Mar. 20, 2003

(51) Int. Cl.[7] .............................................. F24F 11/06
(52) U.S. Cl. .................... 165/247; 165/80.2; 454/184; 62/259.2; 361/695
(58) Field of Search ......................... 165/80.1, 80.2, 165/80.3, 247; 454/184; 62/255, 259.2; 361/695, 700

(56) References Cited

U.S. PATENT DOCUMENTS

| | | | | |
|---|---|---|---|---|
| 3,609,991 A | * | 10/1971 | Chu et al. | |
| 3,815,377 A | * | 6/1974 | Tyree, Jr. | 62/62 |
| 4,552,303 A | * | 11/1985 | Fisher et al. | 165/276 |
| 4,593,360 A | * | 6/1986 | Cocks | 239/416 |
| 4,616,777 A | * | 10/1986 | Fisher et al. | 165/249 |
| 4,730,772 A | * | 3/1988 | Lortie et al. | 236/44 R |
| 4,817,865 A | * | 4/1989 | Wray | 165/247 X |
| 4,997,030 A | * | 3/1991 | Goto et al. | 165/247 X |
| 5,076,346 A | * | 12/1991 | Otsuka | 165/247 X |
| 5,207,613 A | * | 5/1993 | Ferchau et al. | 454/184 |
| 5,220,804 A | * | 6/1993 | Tilton et al. | 361/700 |
| 5,253,484 A | * | 10/1993 | Corman et al. | 62/259.2 X |
| 5,261,243 A | * | 11/1993 | Dunsmore | 62/259.2 X |
| 5,315,793 A | * | 5/1994 | Peterson et al. | 451/2 |
| 5,315,837 A | * | 5/1994 | Lego | 62/255 X |
| 5,474,120 A | * | 12/1995 | Severson et al. | 361/695 X |
| 5,478,584 A | * | 12/1995 | Donohue et al. | 62/380 |
| 5,503,032 A | * | 4/1996 | Tikhtman et al. | 165/247 X |
| 5,565,180 A | * | 10/1996 | Spink | 423/220 |
| 5,576,218 A | * | 11/1996 | Zurek et al. | 436/174 |
| 5,718,117 A | * | 2/1998 | McDunn et al. | 62/259.2 X |
| 5,718,628 A | * | 2/1998 | Nakazato et al. | 454/184 |
| 5,740,018 A | * | 4/1998 | Rumbut, Jr. | 62/259.2 X |
| 5,806,762 A | * | 9/1998 | Herr et al. | 236/1 E |
| 5,903,433 A | * | 5/1999 | Gudmundsson | 165/80.3 X |

(Continued)

OTHER PUBLICATIONS

Beitelmal et al., "Effects of Surface Roughness on the Average Heat Transfer of an Impinging Air Jet," Int. Comm. Heat Mass Transfer, vol. 27, No. 1, pp. 1–12, 2000.

Beitelmal et al., "The Effect of inclination on the heat transfer between a flat surface and an impinging two-dimensional air jet," International Journal of Heat and Fluid Flow, vol. 21, pp. 156–163, 2000.

*Primary Examiner*—Ljiljana Ciric

(57) ABSTRACT

A cooling system is configured to supply individually metered amounts of cooling fluid to heat generating components of an electronic system. The cooling system includes at least one variable speed fan configured to supply fluid through a centralized plenum and thereafter through a plurality of nozzles to the components of the electronic system. Each of the nozzles contains a valve to control the amount of fluid flow through the each of the nozzles. A controller is provided to control the operation of the variable speed fan and the operation of each of the valves is also controlled by a controller.

20 Claims, 7 Drawing Sheets

U.S. PATENT DOCUMENTS

| | | | | |
|---|---|---|---|---|
| 5,907,473 A | * | 5/1999 | Przilas et al. | 165/80.4 |
| 5,943,211 A | * | 8/1999 | Havey et al. | 62/259.2 X |
| 6,026,896 A | * | 2/2000 | Hunter | 165/80.2 |
| 6,108,206 A | * | 8/2000 | Criniti et al. | 361/695 X |
| 6,129,285 A | * | 10/2000 | Schafka | 236/44 C |
| 6,134,108 A | | 10/2000 | Patel et al. | 361/695 |
| 6,159,091 A | * | 12/2000 | Horstman et al. | 62/259.2 X |
| 6,205,796 B1 | * | 3/2001 | Chu et al. | 361/700 |
| 6,205,799 B1 | * | 3/2001 | Patel et al. | 165/104.33 |
| 6,415,619 B1 | * | 7/2002 | Bash et al. | 62/228.4 |
| 6,427,466 B1 | * | 8/2002 | Livni | 62/259.2 |
| 6,490,877 B2 | * | 12/2002 | Bash et al. | 62/259.2 |
| 6,525,935 B2 | * | 2/2003 | Casebolt | 361/695 |
| 6,525,936 B2 | * | 2/2003 | Beitelmal et al. | 165/122 |
| 6,574,104 B2 | * | 6/2003 | Patel et al. | 165/80.3 |
| 6,578,828 B2 | * | 6/2003 | Terrell et al. | 261/30 |
| 6,616,524 B2 | * | 9/2003 | Storck et al. | 454/184 |
| 6,628,520 B2 | * | 9/2003 | Patel et al. | 454/184 |
| 6,644,058 B2 | * | 11/2003 | Bash et al. | 62/259.2 |
| 2002/0152932 A1 | * | 10/2002 | Beiteimal et al. | 361/695 |

* cited by examiner

METHOD AND APPARATUS FOR INDIVIDUALLY COOLING COMPONENTS OF ELECTRONIC SYSTEMS

FIELD OF THE INVENTION

This invention relates generally to electronic component cooling systems. More particularly, the invention pertains to a cooling system for delivering jets of fluid in individually metered amounts to components of a multi-component system.

BACKGROUND OF THE INVENTION

Some of the components (e.g., processors, microcontrollers, high speed video cards, disk drives, semiconductor devices, and the like) of an electronic system (e.g., computer system, entertainment system, and the like) are known to generate relatively significant amounts of heat. The heat generating components, along with other components of the electronic system, are typically mounted on one or more printed circuit (PC) boards to thereby form a computer subsystem. Moreover, it is generally known that the performance and/or reliability of the components typically deteriorate as the temperature of the components increase. In an effort to improve the performance and/or reliability of electronic systems, they are typically equipped with a mechanism to provide a cooling fluid, e.g., air, flow through a housing surrounding the electronic systems to remove the generated heat. In these types of electronic systems, a fan or blower directs a tangential flow of cooling fluid across the PC board and heat sinks to cool the components by convection.

Dissipating the heat generated by these components becomes ever more difficult as the electronic systems incorporate greater numbers of components. By way of example, some high-end servers can house as many as 64 microprocessors, with associated memory devices and ASICS, dissipating up to 20 kilowatts. Conventional cooling systems may be unable to adequately cool these types of electronic systems. For instance, the cooling fluid flow across a PC board may be relatively impeded by installation of the additional components blocking the fluid flow.

In addition, the tangential, unidirectional nature of the fluid flow as the number of components increases as well as the number of the subsystems, typically causes the multiple components to be cooled in series. As a consequence, the cooling fluid flow may be a few degrees warmer than expected, thus causing components located relatively downstream to be cooled less than expected. This drawback may be somewhat alleviated by using a high fluid flow rate and by using heat sinks having a relatively large surface area. The large bulk volume flow can also require the use of several blowers and relatively large exhaust ducting. The resulting size and complexity of these types of cooling systems have substantially detracted from their commercial viability, e.g., by adding additional costs to the overall electronic systems. In addition, the use of additional blowers generally increases the amount of energy and/or the space required to operate the cooling systems, thereby increasing the operating costs.

In addition, various components in electronic systems typically generate various amounts of heat and thus require various levels of cooling. Conventional cooling systems are typically operated in a substantially uniform manner, regardless of the level of heat generated by the individual components. By way of example, conventional cooling systems are generally designed to operate according to a worst-case scenario. That is, cooling fluid is supplied to the components at around 100% of the estimated cooling requirement. In one respect, conventional cooling systems often attempt to cool components that may not be operating at a level which may cause its temperature to exceed the predetermined temperature range. Consequently, conventional cooling systems often incur a greater amount of operating expense than is necessary to sufficiently cool the heat generating components.

SUMMARY OF THE INVENTION

According to one aspect, the present invention pertains to a system for cooling heat generating components. The system includes a variable speed blower and a plenum having an inlet and a plurality of outlets, wherein the inlet of said plenum is in fluid communication with the blower. The system also includes a plurality of tubes, each of the tubes having a first end and a second end. The first ends of the tubes are connected to the plurality of outlets of the plenum and the second ends of the tubes terminate at a location substantially close to at least one heat generating component. In addition, a valve is located along each of the tubes to independently vary a flow of the fluid through each of the tubes.

According to another aspect, the present invention pertains to a method of efficiently cooling a plurality of heat generating components of an electronic system having an enclosure and a plenum located within the enclosure. In the method, at least one variable speed blower and a plurality of valves are activated. Each of the valves terminates substantially close to a respective heat generating component, to thereby supply cooling fluid to the heat generating components. The temperatures of each of the heat generating components are each sensed. It is determined whether the sensed temperatures are within a predetermined temperature range. In addition, the supply of the cooling fluid to the heat generating components is varied in response to the sensed temperatures.

According to yet another aspect, the present invention relates to a rack system for housing a plurality of heat generating components. The rack system includes an enclosure having a plenum, the plenum including a divider separating the plenum into a first chamber and a second chamber. The second chamber includes a plurality of outlets for discharging the cooling fluid and the plenum extends generally along a side of the enclosure. The rack system also includes at least one variable speed blower configured to supply cooling fluid into the plenum and a plurality of nozzles that have a first end in fluid communication with each of the plurality of outlets and a second end positioned substantially close to a respective one of the heat generating component. The rack system further includes a plurality of valves, each of the valves being operable to vary the flow of the cooling fluid through each of the nozzles.

In comparison to known cooling mechanisms and techniques, certain embodiments of the invention are capable of achieving certain aspects, including some or all of the following: (1) substantially focalized supply of cooling fluid to individual heat generating components; (2) independent control of the fluid supply to the heat generating components; (3) energy efficient utilization of a plurality of blowers by operating them substantially only as needed; (4) substantial supply of cooling fluid individually varied in accordance with actual or anticipated temperatures of the heat generating components. Those skilled in the art will appreciate these and other benefits of various embodiments of the invention upon reading the following detailed description of a preferred embodiment with reference to the below-listed drawings.

BRIEF DESCRIPTION OF THE DRAWINGS

Features and advantages of the present invention will become apparent to those skilled in the art from the following description with reference to the drawings, in which.

DETAILED DESCRIPTION OF THE INVENTION

Figure 7:
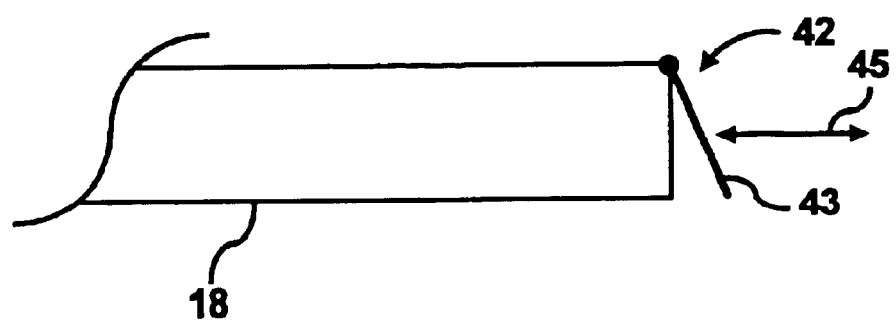
FIG. 7 shows an enlarged frontal elevational view of a nozzle and a pulsating valve according to an embodiment of the invention.

FIG. 7 shows an enlarged frontal elevational view of a nozzle and a pulsating valve according to an embodiment of the invention.

For simplicity and illustrative purposes, the principles of the present invention are described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structure have not been described in detail so as not to unnecessarily obscure the present invention.

According to a preferred embodiment of the present invention, a cooling system is configured to supply individually metered amounts of cooling fluid to heat generating components, e.g., processors, micro-controllers, high speed video cards, disk drives, semiconductor devices, and the like, of an electronic system. Electronic systems may include computer systems and entertainment systems, to name a few. The cooling system includes at least one variable speed fan, e.g., blower, configured to supply cooling fluid, e.g., air, through a centralized plenum and thereafter through a plurality of nozzles to the components of the electronic system. Each of the nozzles contains a valve to control the amount of fluid flow through the each of the nozzles. A controller is provided to control the operation of the variable speed fan and the operation of each of the valves is also controlled by a valve controller. By substantially controlling the amount of cooling fluid supplied to each of the components based upon the amount of heat generated by each component, the cooling system of the present invention may operate in a more efficient manner, thereby requiring substantially less energy than conventional cooling systems.

Figure 1:
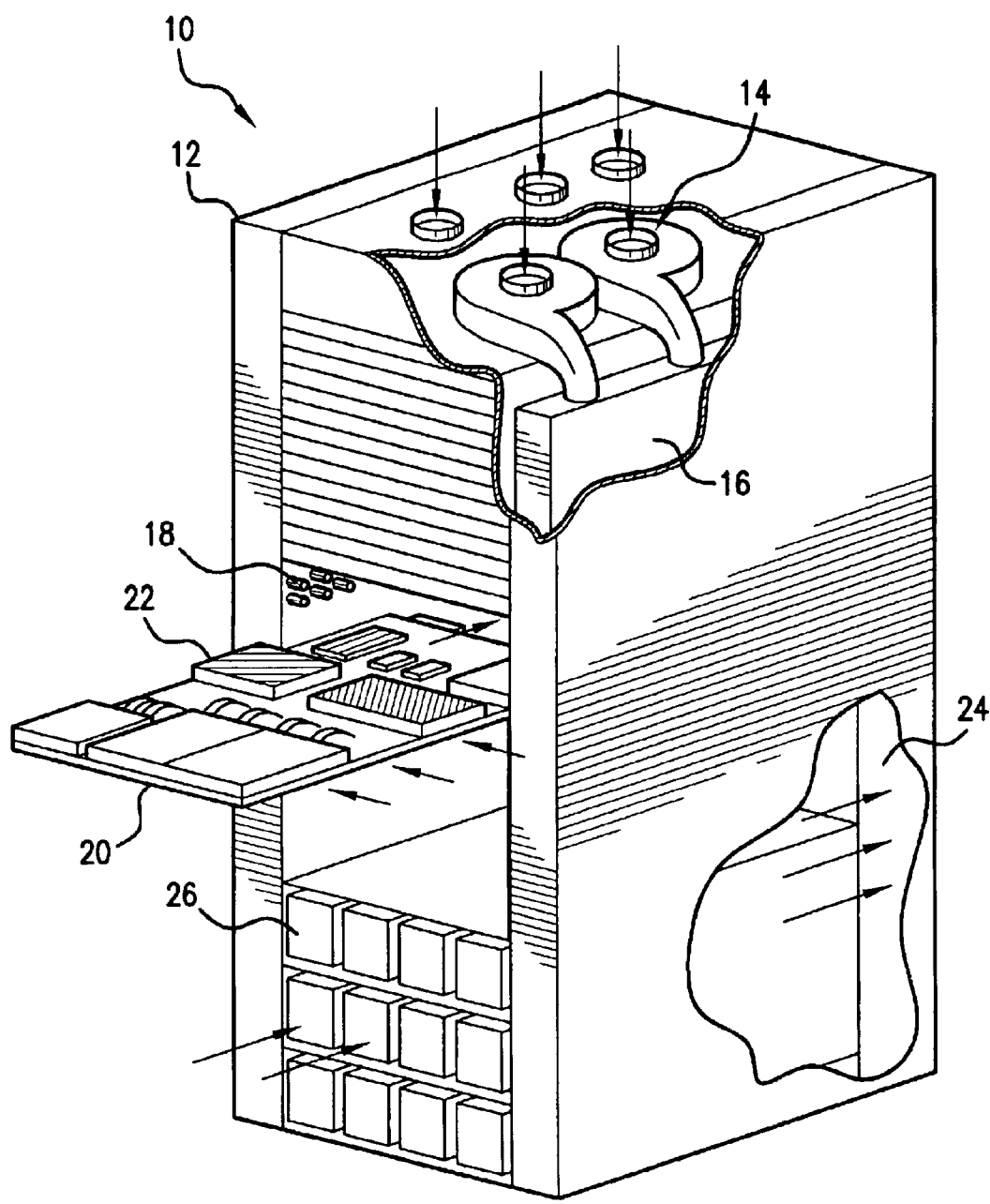
FIG. 1 shows a perspective view of a simplified illustration of an electronic device, partly in section, in this instance a rack system, constructed in accordance with an embodiment of the present invention.

FIG. 1 shows a perspective view of a simplified illustration of an electronic device, partly in section, in this instance a rack system 10, constructed in accordance with an embodiment of the present invention, which may be used for housing a plurality of electronic components, e.g., subsystems, in an industrial, office, home or other environment. In addition, the present invention may be practiced in a variety of electronic devices. For instance, it is contemplated, although not limited, that an embodiment of the present invention may be practiced in large and small scale rack systems, to name a few. For convenience, certain concepts of the present invention are depicted in the environment of the rack system 10 illustrated in FIG. 1.

While it is apparent that the parts of a rack system 10 may vary from model to model, the rack system includes an enclosure 12. The rack system 10 also includes a plurality of blowers 14 operable to draw fluid from outside the enclosure 12 and deliver the fluid to the space within the enclosure. The blowers 14 are variable speed blowers because they are configured to vary the amount of cooling fluid delivered to the components within the rack system 10. Because the specific type of blower to be used with the concepts of the invention may vary according to individual needs, the invention is not limited to any specific type of blower and may thus utilize any reasonably suitable type of blower that is capable of accomplishing certain aspects of the invention. In this regard, the blowers 14 may comprise any reasonably suitable blower that is capable of varying the amount of fluid delivered to the space within the enclosure. The choice of blower 14 may depend upon a plurality of factors, e.g., cooling requirements, costs, operating expenses, etc.

The number of blowers 14 implemented in accordance with an embodiment of the invention may vary according to individual needs. Accordingly, the invention is not limited to any specific number of blowers and may thus utilize any reasonably suitable number of blowers that is capable of accomplishing certain aspects of the invention. According to a preferred embodiment of the present invention, at least two blowers 14 are implemented to thereby enable a redundant fluid supply, in the event that one of the blowers malfunctions. In addition, a plurality of blowers 14 may be provided to deliver fluid to both sides of the enclosure 12. In this respect, cooling fluid may be substantially simultaneously delivered through both sides of the enclosure 12.

The outlets of the blowers 14 are in fluid communication with a plenum 16. The plenum 16 is in fluid communication with a plurality of nozzles 18. The nozzles 18 have a first end and a second end, in which the first end is connected to the plenum 16. The second ends of the nozzles 18 are configured to outlet fluid from the blowers 14 to one or more heat generating components 22 of a subsystem 20, as will be described in greater detail hereinbelow with respect to FIG. 2. A subsystem 20 may comprise a server. The cooling fluid supplied by the blowers 14, having been relatively heated by the heat generating components 22, may be expelled through an opening through the enclosure 12 as indicated by arrows 24. The rack system 10 may also include a plurality of power modules 26 for supplying power to the components of the subsystems 20 as well as the cooling system.

Figure 2:
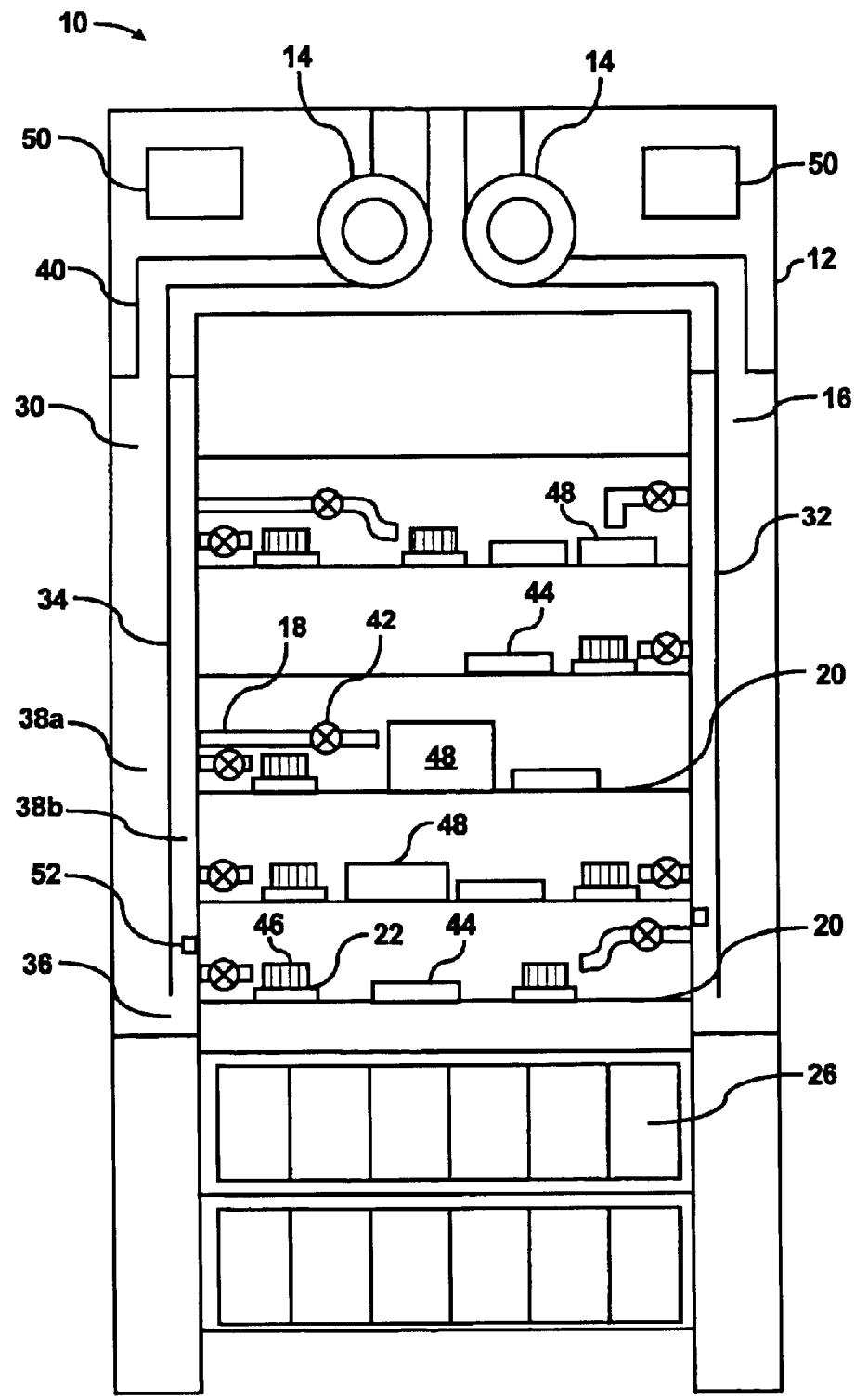
FIG. 2 shows a cross-sectional frontal elevational view of the simplified illustration of the electronic device illustrated in FIG. 1.

Referring now to FIG. 2, there is shown a cross-sectional frontal elevational view of the simplified illustration of the rack system 10 illustrated in FIG. 1. As seen in FIG. 2, according to a preferred embodiment of the present invention, blowers 14 are situated to deliver cooling fluid to plena 16, 30 located on both sides of the enclosure 12. Although not illustrated in FIG. 2, a plurality of blowers 14 may be provided to deliver cooling fluid to each of the plena 16, 30 for the purpose of providing a redundant cooling fluid supply to the heat generating components 22. According to an exemplary embodiment, the plena 16, 30 each extend substantially the entire width of the enclosure 12 such that a plurality of blowers 14 may supply cooling fluid to each of the plena 16, 30. Alternatively, although not shown in FIG. 2, the plena 16, 30 may comprise a plurality of separate passageways without deviating from the scope of the present invention.

The rack system 10 may also include a single plenum 16 along with an associated one or more blower 14. In this instance, cooling fluid flow may be delivered to the components through nozzles having various lengths and extending from the single plenum 16. According to this embodiment, the fluid flow entering into the enclosure 12 may be directed into a single direction to thereby substantially prevent counteracting fluid flows within the enclosure. It is, however, envisioned that the present invention may operate with the two plena 16, 30 configuration illustrated in FIG. 2. For example, a fan (not shown) may be incorporated into the rack system 10 to generally enable heated fluid within the enclosure 12 to be expelled in the manner illustrated in FIG. 1. In this respect, the counteracting fluid flows from the plenums 16, 30 may be substantially obviated.

The rack system 10 is shown as including five subsystems 20 and associated components 22, 48 for illustrative purposes only. Rack systems 10 have been known, however, to include upwards of forty (40) or more subsystems 20. It may thus be seen that the greater the number of subsystems 20, and subsequent increase in the number of heat generating components 22, 48, the greater is the output required from each blower 14 to cool the components. By substantially limiting the amount of cooling fluid delivered to the heat generating components 22, 48, even by a relatively small amount, the output required from each blower 14 may be substantially reduced. The substantial reduction in the output of the blowers 14 generally equates to a reduction in the power consumed by the blower, which, in turn equates to a savings in operating costs.

According to a preferred embodiment of the present invention, the cooling fluid flow through each of the nozzles 18 may be controlled to flow therethrough at relatively uniform velocities. One manner in which the fluid flow may be controlled is to ensure that the pressure of the fluid supplying each of the nozzles is substantially uniform. In this respect, each of the plena 16, 30 may include a respective divider 32, 34. The width of the dividers 32, 34 may extend substantially along the entire width of each plenum 16, 30. The height of the dividers 32, 34 may be slightly shorter than each of the plena 16, 30 to thus create a gap 36 between a bottom edge of the dividers and a bottom inner surface of the plena. The dividers 32, 34 generally divide the space within the plena 16, 30 into two relatively separate chambers 38a, 38b. The first chamber 38a is in fluid communication with a baffle 40 connected to the blower 14. The second chamber 38b is in fluid communication with the first chamber 38b substantially only through the gap 36. In this respect, the cooling fluid flow originating from the blower 14 must travel substantially the entire height of the plenum 30, i.e., through the first chamber 38a, for the fluid flow to enter into the second chamber 38b.

The fluid in the second chamber 38b may be maintained at a substantially uniform static pressure by virtue of the manner in which the fluid is introduced into the second chamber 38b. Fluid is supplied into the first chamber 38a by the blower 14 at a relatively high rate thereby causing a relatively large amount of turbulence in the fluid located in the first chamber 38a. Because of the distance the fluid must travel to enter into the second chamber, by the time the fluid reaches the gap 36, the fluid has substantially stabilized, thus enabling the fluid entering into the second chamber 38b to be relatively calm. In this respect, the fluid inside the second chamber 38b may be maintained at a relatively uniform pressure.

A plurality of nozzles 18 are in fluid communication with the second chamber 38b of the plenum 30 through attachment of respective first ends thereof to the second chamber 38b. Each of the nozzles 18 includes a respective valve 42 to individually meter the flow of fluid to each of the components 22, 48. Each of the valves 42 may be electronically controlled by a valve controller 44. A specific type of valve 42 is not required to be utilized with this exemplary embodiment of the present invention, but rather, any reasonably suitable type of controllable metering valve may be utilized. An example of a suitable valve 42 includes a valve operable to increase or decrease the amount of fluid flowing to a component. If the exemplary cooling system of the invention employs this type of valve 42, the valve controller 44 may be operable to vary the flow of fluid to the component at a wide range of flow rates by controlling the size of the opening through which the fluid flows through the nozzle 18. Another example of a suitable valve includes a pulsating valve 42, as shown in FIG. 7, which shows a simplified illustration of a pulsating valve 42. In this type of valve 42, a constant diameter opening may be covered by a lid 43 that is operable to open and close the opening by pulsating, as shown by the arrow 45. The flow rate of the fluid through the nozzle 18 may be controlled by the valve controller 44 by varying the frequency of pulsation. For instance, the frequency of pulsation may be increased to decrease the flow rate and the frequency may be decreased to increase the flow rate.

Some of the heat generating components 22, e.g., microprocessors, which generate relatively significant amounts of heat, are illustrated as comprising heat sinks 46 attached to upper surfaces thereof. Other components 48, e.g., memory devices and ASICS, which generate lesser amounts of heat but nevertheless still require supplemental cooling are not illustrated as having heat sinks. The heat sinks 46 may be attached to the heat generating components 22, for example, by soldering, epoxy, thermal compound, and the like). Alternatively, the heat sinks 46 may be mechanically clamped to the heat generating components 22. A specific type of heat sink is not required to be utilized with the cooling system of the present invention, but rather, any suitable type of heat sink may be employed. For example, one skilled in the art would readily recognize that a plurality of variously configured heat sinks may be employed with the exemplary embodiment of the present invention without deviating from the scope thereof.

In any event, the second ends of some of the nozzles 18 located generally away from the plena 16, 30 terminate at a substantially close distance to each of the components 22 and 48. Alternatively, some of the components 48 may be positioned generally behind a heat generating component 22 to thereby receive supplemental fluid flow directed at the heat generating component 22. The distance between the second ends and the heat sinks 46 and/or the components 48 may be determined based upon testing to optimize the heat transfer from the heat sinks and/or the components into the cooling fluid. In one respect, the distance may be set such that the impinging zone of the fluid flow is substantially directly located within the area of the heat sinks 46 and/or the components 48 to thereby increase the potential for maximum heat transfer. Because the fluid from the nozzles 18 generally flows into the fluid located substantially adjacent to the components 22, 48, the flow is considered as being submerged. The fluid flow from the nozzles 18 thus mixes with the adjacent fluid, thereby causing the fluid flow to expand. The mixing of the fluid causes the flow rate of the fluid from the nozzles 18 to generally increase, however, the maximum velocity of the fluid from the nozzles generally decreases. There is thus a relatively optimum distance where the second ends of the nozzles 18 may be positioned with respect to the components 22, 48 to maximize both flow rate and velocity of the fluid from the nozzles.

According to an exemplary embodiment, each subsystem 20 of the rack system 10 may include at least one valve controller 44. As described hereinabove, the valve controller 44 is operable to manipulate the valves 42 to thereby control the flow of fluid through each of the nozzles 18. The valve controller 44 may manipulate the valves 42 based upon the actual temperature of each of the heat generating components 22, 48 or through an anticipated temperature of each of the components. The actual temperature of the heat generating components 22, 48 may be determined by a temperature sensor (not shown), e.g., thermocouple, located on the heat generating component 22, 48 or the heat sink 46. For example, the temperature sensor may be integrally formed with the heat generating component 22, 48, the heat sink 46, or the temperature sensor may be attached on the heat generating component or the heat sink. The anticipated temperature of the heat generating components 22, 48 may be predicated upon an impending load on the heat generating component. For example, the valve controller 44 may be connected to another controller, e.g., a central controller for the subsystems, which anticipates the heat load the components 22, 48 will dissipate. This information may be relayed to the valve controller 44 which may then manipulate the valve 42 according to the anticipated load.

In any event, if there is an actual change or an anticipated change in the temperature of the respective heat generating components 22, 48, the valve controller 44 generally operates to manipulate the corresponding valve 42 to compensate, i.e., changes the flow rate of the cooling fluid, for the change in temperature. In this respect, each of the components 22, 48 generally receives substantially only the amount of cooling fluid necessary to maintain the temperature of the components 22, 48 within a predetermined temperature range. As will be seen from the discussion hereinbelow, by controlling the cooling fluid flow in this manner, the blowers 14 may be operated at a substantially optimized level, thereby decreasing the amount of energy and thus the operating costs required to operate the blowers 14.

The amount of cooling fluid the blowers 14 deliver to the plena 16, 30 is controlled by one or more blower controllers 50. The blower controllers 50 may control the speed, and thus the fluid intake, of the blowers 14 in a variety of different manners. By way of example, the blower controllers 50 may control the speed of the blowers 14 by adjusting the amount of power supplied to the blowers. Alternatively, the blower controllers 14 may adjust the speed of the blowers 14 in any manner generally known to those skilled in the art. In any respect, the blower controllers 50 may operate to manipulate the blowers 14 in response to a variety of factors. By way of example, the speed of the blowers 14 may be manipulated, e.g., either increased or decreased, in response to manipulation of the valves 42, e.g., to increase or decrease the flow rate of the cooling fluid. In this instance, the blower controllers 50 may be connected either directly or indirectly to the valve controllers 44 such that any manipulation of the valves 42 will be automatically detected by the blower controllers to thereby adjust the speed of the blowers 14.

As another example, the blower controllers 50 may operate to manipulate the speed of the blowers 14 in response to changes in pressure within the plena 16, 30. In this instance, a pressure sensor 52 may be situated either at one location or at various locations within the plena 16, 30. The measurements obtained by the pressure sensor 52 may be relayed to the blower controllers 50. The blower controllers 50 may detect any discernable change in the pressure of the fluid located within the plena 16, 30 and alter the blower speed accordingly. For example, if the pressure sensor 52 measures a change in the pressure, or alternatively, if the pressure sensor detects a predetermined degree of pressure change, the blower controllers 50 may control the blowers 14 to alter their speeds. In this respect, the amount of energy expended to supply the heat generating components 22, 48 with cooling fluid is substantially optimized. Therefore, only that amount of energy required to substantially cool the heat generating components 22, 48 is expended, which correlates to a substantial energy savings over known cooling systems.

Figure 3:
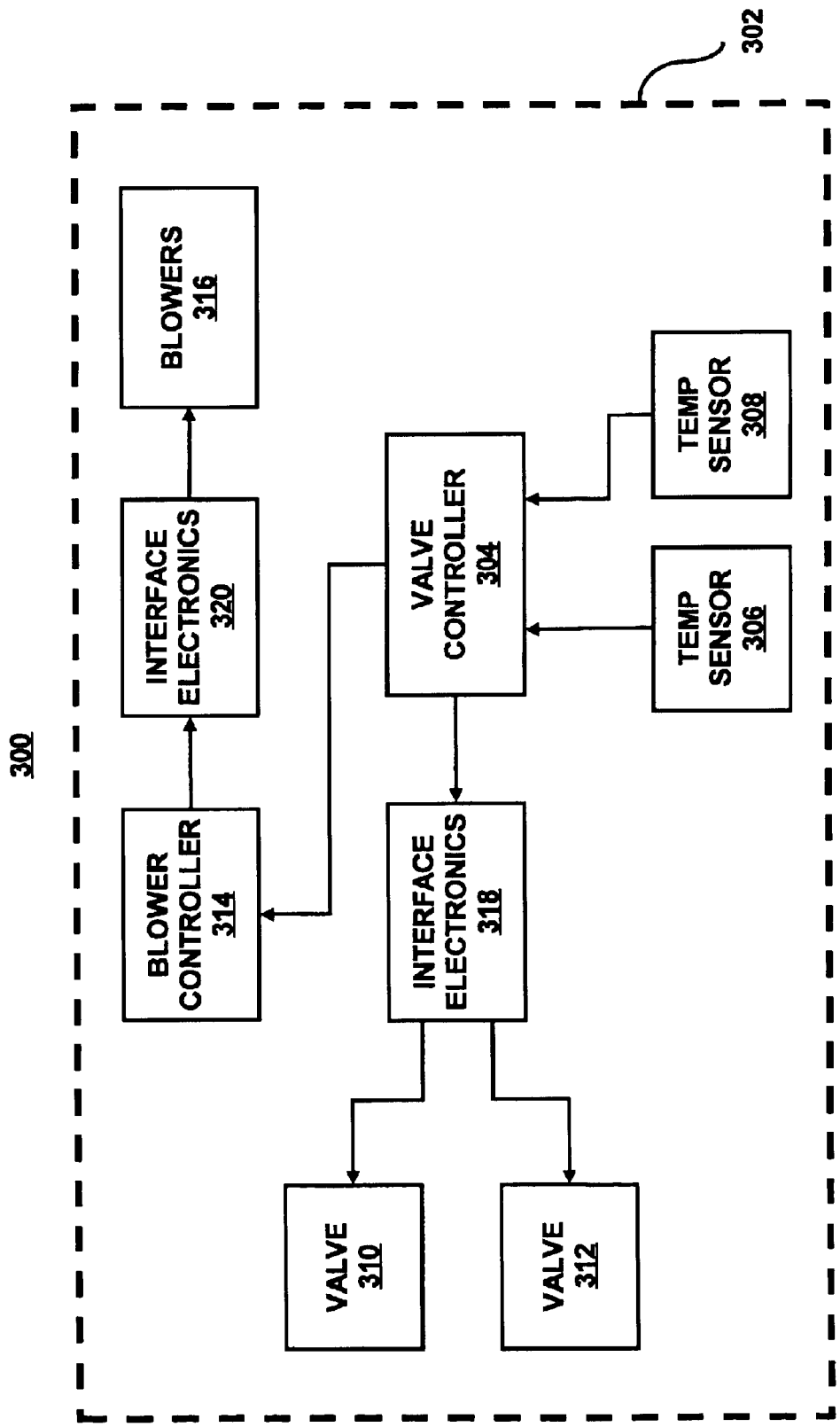
FIG. 3 shows a block diagram of a first exemplary control scheme for a cooling system according to a first embodiment of the present invention.

FIG. 3 shows a block diagram 300 of a first exemplary control scheme for a cooling system 302 according to a first embodiment of the present invention. The following description of the block diagram 300 illustrates one manner in which the cooling system 302 may be operated in accordance with a first embodiment of the present invention. In this respect, it is to be understood that the following description of the block diagram 300 is but one manner of a variety of different manners in which such a cooling system 302 may be operated.

The valve controller 304 is configured to receive the measured temperatures of a plurality of heat generating components, e.g., heat generating components 22, 48. In this regard, the controller 304 may comprise a microprocessor, a micro-controller, an application specific integrated circuit, ASIC and the like. The temperatures of the heat generating components may be measured by temperature sensors 306 and 308. Although FIG. 3 illustrates two temperature sensors 306 and 308, it should be understood that the number of temperature sensors is not critical to the operation of the first embodiment of the invention. Instead, the cooling system 302 may include any reasonably suitable number of temperature sensors to thus measure the temperatures of any reasonably suitable number of heat generating components. According to a preferred embodiment, the number of temperature sensors and thus the temperature measurements of the number of heat generating components may be upgradable, e.g., scalable, to include any additional heat generating components that may be included in a rack system, for example.

The temperature sensors 306 and 308 may be integrally formed with the heat generating component and/or heat sink. Alternatively, the temperature sensors 306 and 308 may be attached to the heat generating components and/or the heat sinks by any suitable means known to those of skill in the art. In any event, the temperatures measured by the temperature sensors 306 and 308 for the individual heat generating components are relayed to the valve controller 304.

As an alternative to the temperature sensors 306 and 308, the valve controller 304 may be configured to anticipate the temperatures of the heat generating components. The anticipated temperatures of the heat generating components may be predicated upon impending loads on the heat generating components. For example, the valve controller 304 may be connected to another controller (not shown), e.g., a central controller for the subsystem, which anticipates the heat load the components will dissipate. This information may be relayed to the valve controller 304 which may then manipulate the valves 310 and 312 according to the anticipated loads.

The valve controller 304 is additionally configured to control valves 310 and 312. Interface electronics 318 may be configured to provide an interface between the valve controller 304 and the components for operating the control valves 310 and 312, e.g., a motor to control the opening in the valves, device for operating the pulsating valve (not shown), etc. As stated hereinabove, the valves 310 and 312 may comprise any reasonably suitable type of valve capable of altering the flow of fluid therethrough, e.g., pulsating valve.

Although FIG. 3 illustrates two valves 310 and 312, it should be understood that the number of valves is not critical to the operation of the first embodiment of the invention. Instead, the cooling system 302 may include any reasonably suitable number of valves 310 and 312 to thus control the flow of cooling fluid delivered to any reasonably suitable number of heat generating components. According to a preferred embodiment, the number of valves 310 and 312 and thus the number of heat generating components may be upgradable, e.g., scalable, such that the valve controller 304 may operate to control the flow of cooling fluid to subsequently added heat generating components.

The valve controller 304 may be configured to manipulate the valves 310 and 312 independently of one another. In this respect, the valve controller 304 may control the valve 310 to increase the flow of fluid therethrough in response to an increase in temperature of a corresponding heat generating component while maintaining a relatively uniform flow of fluid through the valve 312. Consequently, each of the heat generating components may receive substantially only that amount of cooling generally necessary to maintain the respective heat generating components within a predetermined temperature range.

The controller 304 is further configured to relay information signals to a blower controller 314 which controls the operation of a plurality of blowers 316. Interface electronics 320 may be configured to provide an interface between the blower controller 314 and the components for operating the blowers 316, e.g., voltage supply to the blowers, mechanism to control the speed of the blowers (not shown), etc. The number of blowers 316 is not critical to the operation of the first embodiment of the invention. Instead, the cooling system 302 may include any reasonably suitable number of blowers 316 to deliver cooling fluid to the heat generating components. According to an exemplary embodiment, a plurality of blowers 316 are employed in the cooling system 302, with each of the blowers 316 configured to supply cooling fluid to common plena, to thereby create a redundant fluid intake system. The blower controller 314 may operate the blowers 316, e.g., vary the speeds of the blowers, in response to the manipulation of the valves 310 and 312 by the valve controller 304.

Figure 4:
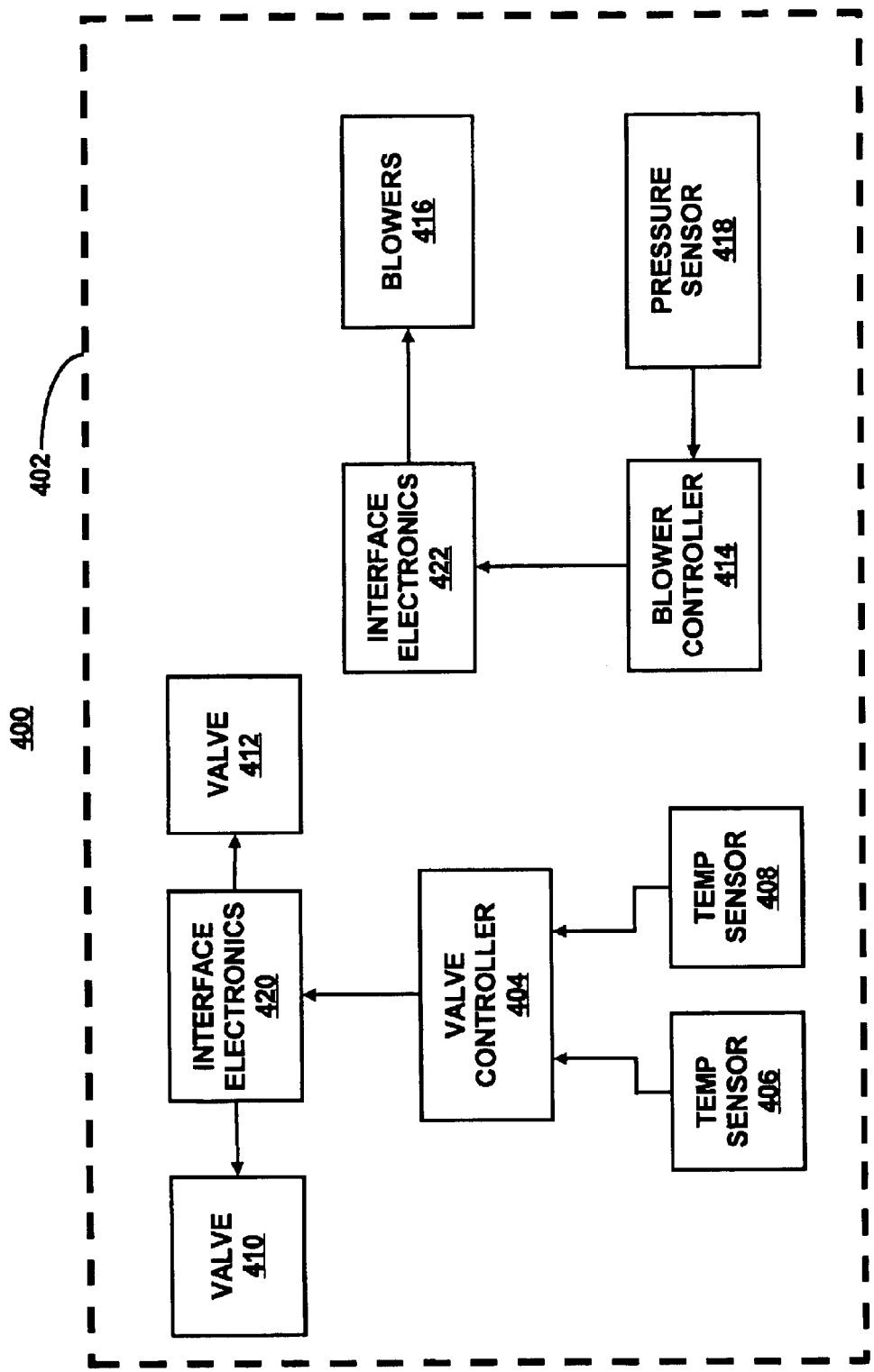
FIG. 4 shows a block diagram of a second exemplary control scheme for a cooling system according to a second embodiment of the present invention.

FIG. 4 shows a block diagram 400 of a second exemplary control scheme for a cooling system 402 according to a second embodiment of the present invention. The elements illustrated in the block diagram 400 operate in substantially the same manner as those elements illustrated in the block diagram 300, except that the blower controller 414 is configured to operate independently of the valve controller 404. For example, the valve controller 404 operates in substantially the same manner as the valve controller 302. In this respect, only those elements in the block diagram 400 that differ from those elements in the block diagram 300 will be described hereinbelow. In this respect, interface electronics 420 may be configured to provide an interface between the valve controller 404 and the components for operating the control valves 410 and 412, e.g., a motor to control the opening in the valves, device for operating the pulsating valve (not shown), etc. In addition, interface electronics 422 may be configured to provide an interface between the blower controller 414 and the components for operating the blowers 416, e.g., voltage supply to the blowers, mechanism to control the speed of the blowers (not shown), etc.

A pressure sensor 418 is configured to measure the pressure within the plena of an electronic system, e.g., rack system 10. The pressure measurements obtained by the pressure sensor 418 is relayed to the blower controller 414. In response to changes in the measured pressure, the blower controller 414 manipulates the speed of the blowers 416 to vary the amount of cooling fluid supplied to a plurality of heat generating components. In this respect, the blowers 416 operate to generally maintain the fluid pressure within the plena at a substantially uniform level. Thus, the blower controller 414 is operable to increase the speed of the blowers 416, e.g., expend a greater amount of energy, substantially as the heat generated by the heat generating components requires such an increase. Consequently, the blowers 416 are not operated at a substantially constant energy level and the amount of energy necessary is substantially lower than that of conventional cooling systems that typically operate at maximum energy levels.

Figure 5:
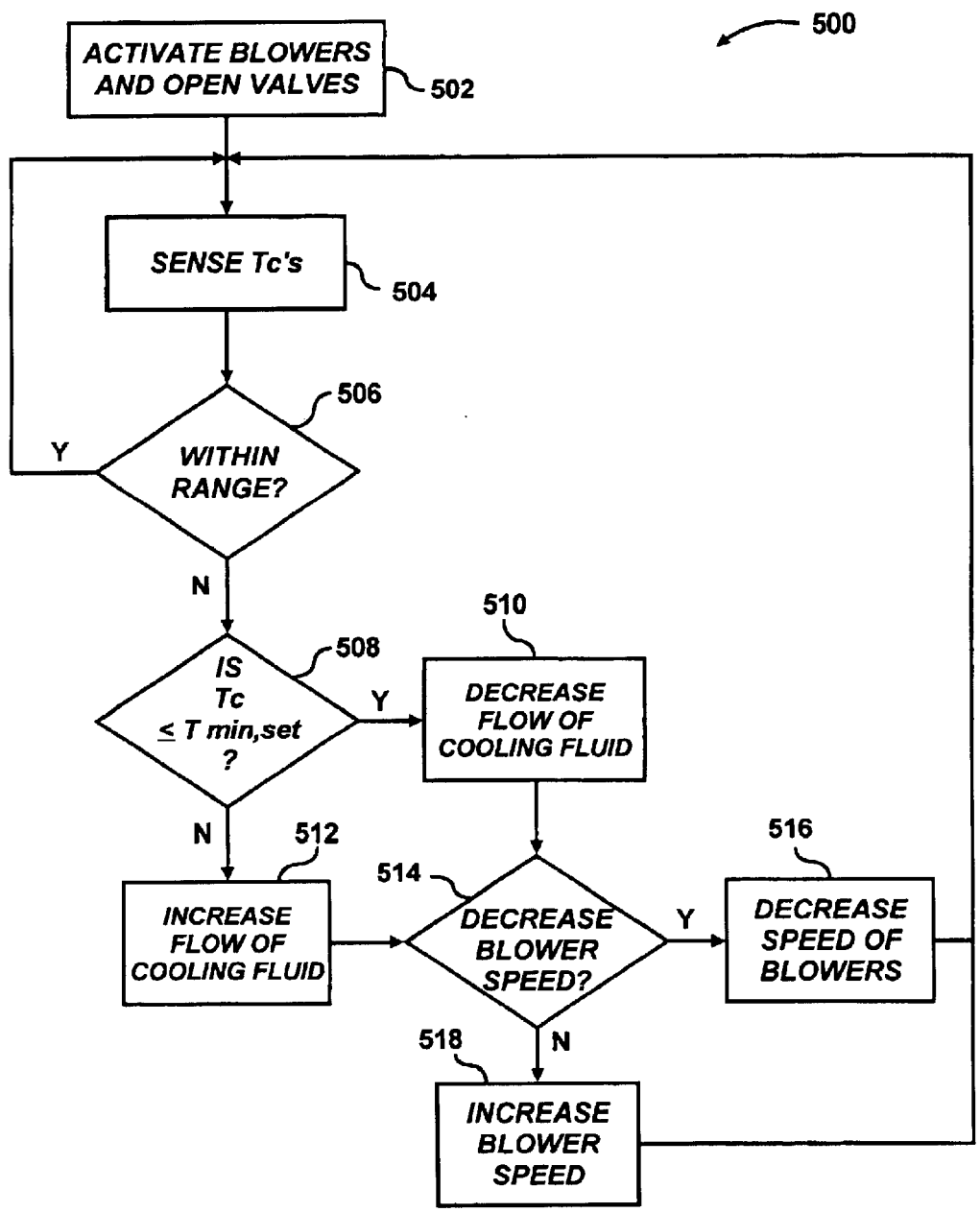
FIG. 5 shows a flow diagram of a first manner in which an embodiment of the present invention may be practiced.

FIG. 5 shows a flow diagram 500 of a first manner in which an embodiment of the present invention may be practiced. The following description of the flow diagram 500 is made with reference to the block diagram 300 illustrated in FIG. 3, and thus makes reference to the elements cited therein. It is to be understood that the steps illustrated in the flow diagram 500 may be contained as a utility, program, subprogram, in any desired computer accessible medium. In addition, the flow diagram 500 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 500, a plurality of blowers 316 are activated and the valves 310 and 312 are opened at step 502. At step 504, the temperatures of the components (Tc's) are individually sensed by the temperature sensors 306 and 308. Alternatively, the Tc's may be anticipated in the manner described hereinabove with respect to FIG. 3. At step 506, it is determined whether each of the measured temperatures are individually within a predetermined range of operating temperatures, e.g., between a maximum set point temperature (Tmax,set) and a minimum set point temperature (Tmin,set). The predetermined range of operating temperatures may be set according to a plurality of factors. These factors may include, for example, the operating temperatures set forth by the manufacturers of the heat generating components, through testing to determine the optimal operating temperatures, etc. In addition, the predetermined range of operating temperatures may vary from one heat generating component on the basis that various components generally may operate effectively at various temperatures.

The temperatures for those heat generating components determined to have temperatures that fall within the predetermined range, are sensed again at step 504. For those heat generating components determined to have temperatures that do not fall within the predetermined temperature range, i.e., fall outside of Tmin,set and Tmax,set, it is determined whether the sensed temperature equals or falls below the Tmin,set at step 508. In general, the range of temperatures Tmin,set and Tmax,set pertains to threshold temperatures to determine whether to increase or decrease the flow of cooling fluid delivered to the individual heat generating components. The predetermined temperature range may be based upon a plurality of factors, for example, a threshold operating range of temperatures that may be determined through testing to substantially optimize the performance of the heat generating components. Moreover, the predetermined temperature range may vary for each heat generating component because various components generally may operate effectively at various temperatures and thus various threshold temperatures may be required.

If the Tc's of some of the heat generating components are below or equal to the Tmin,set, the valve controller 304 may operate to decrease the flow of cooling fluid to those heat generating components at step 510. If the Tc's of some of the heat generating components exceed the Tmin,set (i.e., also exceeds the Tmax,set), the valve controller 304 may operate to increase the flow of cooling fluid to those heat generating components at step 512.

The decrease of cooling fluid flow at step 510 and the increase of cooling fluid flow at step 512 may be accomplished by incrementally varying the fluid flow through the valves. An example will be made for the instance where a valve allows a certain amount of fluid to flow therethrough, and the valve is manipulated to decrease the fluid flow, and where the decrease in fluid flow is insufficient to cause the Tc for that component to fall within the predetermined range. In this instance, during a subsequent run through steps 504–510, the valve will be controlled to further decrease the fluid flow therethrough by an incremental amount. By repeating this process a number of times, the temperature of the component may be substantially brought within the predetermined range.

At step 514, the blower controller 314 may determine whether to decrease the blower speed. The determination of whether to decrease the blower speed may be made in response to the manipulations made to the valves by the valve controller 304. For instance, if the total amount of decrease in the flow of cooling fluid exceeds the total amount of increase in the flow of cooling fluid, the blower controller 314 may operate to decrease the speed of the blowers at step 516. Alternatively, if the total amount of increases in the flow of cooling fluid exceeds the total amount of decreases, the blower controller 314 may operate to increase the blower speed at step 518.

Following steps 516 and/or 518, or if the increases in the flow of cooling fluid through the nozzles equals the decreases, the temperatures of the components are sensed again at step 504. In addition, the steps following step 504 may be repeated for an indefinite period of time so long as the cooling system 302 is in operation.

It should be appreciated that the Tc's of some of the heat generating components may fall below the Tmin,set, whereas the Tc's of other ones of the heat generating components may exceed the Tmax,set. Thus, it should be appreciated that steps 510 and 512 may be respectively and substantially simultaneously performed on the various heat generating components.

Figure 6:
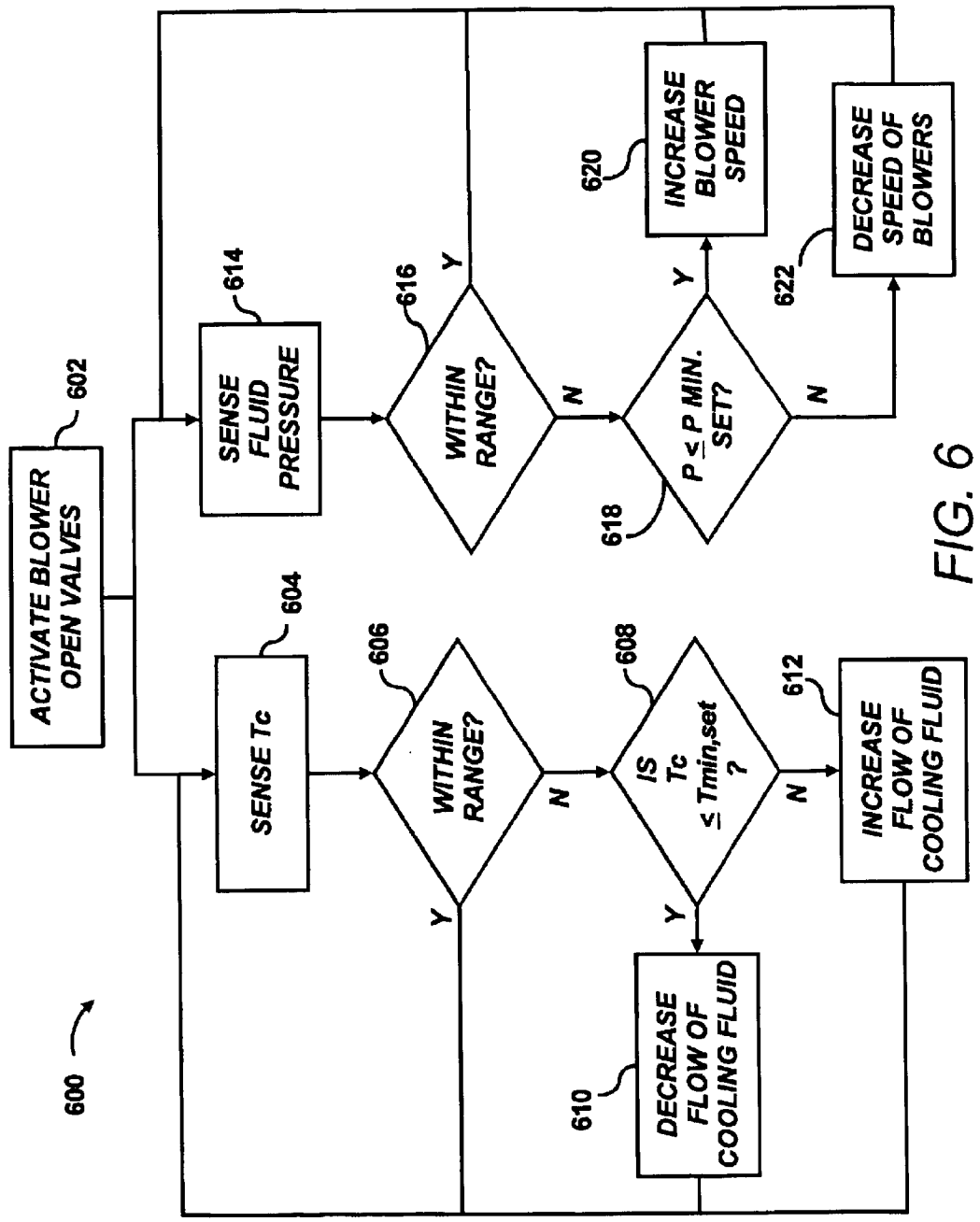
FIG. 6 shows a flow diagram of a second manner in which another embodiment of the present invention may be practiced.

FIG. 6 shows a flow diagram 600 of a second manner in which another embodiment of the present invention may be practiced. The following description of the flow diagram 600 is made with reference to the block diagram 400 illustrated in FIG. 4, and thus makes reference to the elements cited therein. It is to be understood that the steps illustrated in the flow diagram 600 may be contained as a utility, program, subprogram, in any desired computer accessible medium. In addition, the flow diagram 600 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

In the flow diagram 600, a plurality of blowers 416 are activated and the valves 410 and 412 are opened at step 602. At step 604, the temperatures of the components (Tc's) are individually sensed by the temperature sensors 406 and 408. Alternatively, the Tc's may be anticipated in the manner described hereinabove with respect to FIG. 3. At step 606, it is determined whether each of the measured temperatures are individually within a predetermined range of operating temperatures. The predetermined range of operating temperatures may be set according to a plurality of factors. These factors may include, for example, the operating temperatures set forth by the manufacturers of the heat generating components, through testing to determine the optimal operating temperatures, etc. In addition, the predetermined range of operating temperatures may vary from one heat generating component on the basis that various components generally may operate effectively at various temperatures.

The temperatures for those heat generating components determined to have temperatures that fall within the predetermined temperature range, e.g., between a predetermined minimum set point temperature (Tmin,set) and a predetermined maximum set point temperature (Tmax,set), and are sensed again at step 604. For those heat generating components determined to have temperatures that do not fall within the predetermined temperature range, it is determined whether the sensed temperature falls below the Tmin,set at step 608. In general, the predetermined temperature range pertains to threshold temperatures to determine whether to increase or decrease the flow of cooling fluid delivered to the individual heat generating components. The predetermined temperature range may be based upon a plurality of factors, for example, a threshold operating temperature or range of temperatures that may be determined through testing to substantially optimize the performance of the heat generating components. The predetermined temperature range may vary for each heat generating component because various components generally may operate effectively at various temperatures and thus various threshold temperatures may be required.

If the Tc's of some of the heat generating components are below or equal to the Tmin,set, the valve controller 404 may operate to decrease the flow of cooling fluid to those heat generating components at step 610. If the Tc's of some of the heat generating components exceed the Tmin,set (i.e., exceed the Tmax,set), the valve controller 404 may operate to increase the flow of cooling fluid to those heat generating components at step 612.

The decrease of cooling fluid flow at step 610 and the increase of cooling fluid flow at step 612 may be accomplished by incrementally varying the fluid flow through the valves. An example will be made for the instance where a valve allows a certain amount of fluid to flow therethrough, and the valve is manipulated to decrease the fluid flow, and where the decrease in fluid flow is insufficient to cause the Tc for that component to fall within the predetermined range. In this instance, during a subsequent run through steps 604–610, the valve will be controlled to further decrease the fluid flow therethrough by an incremental amount. By repeating this process a number of times, the temperature of the component may be substantially brought within the predetermined range.

At step 614, the pressure of the cooling fluid located in the plena may be measured by a pressure sensor 418. The measured pressure may be relayed to the blower controller 414. The blower controller 414 may determine whether the measured pressure is within a predetermined pressure range, e.g., a predetermined minimum set point pressure (Pmin,set) and a predetermined maximum set point pressure (Pmax,set), at step 616. The predetermined pressure range may be set according to a desired velocity of the cooling fluid to be ejected through the nozzles. In addition, the predetermined pressure range may be the substantial optimum operating pressure desired for controlling the flow of cooling fluid through the nozzles. If the measured pressure is within the predetermined pressure range, the steps beginning with step 604 may be followed again.

If the measured pressure is not within the predetermined pressure range, it is determined whether the measured pressure (P) is below or equal to a minimum pressure set point (Pmin,set) at step 618. In general, the predetermined pressure range pertains to the threshold pressures to determine whether to increase or decrease the supply of fluid into the plena. The predetermined pressure range may be based upon a plurality of factors, for example, a threshold operating pressure or range of pressures that may be determined through testing to substantially optimize the performance of the cooling fluid output through the nozzles.

If the P is determined to be below or equal to the Pmin,set, the blower controller 414 may operate to increase the blower speed, e.g., by increasing the voltage flow to the blower, at step 620. Alternatively, if the P is determined to exceed the Pmin,set, and thereby exceed the Pmax,set, the blower controller 414 may operate to decrease to the blower speed at step 622.

Following steps 620 and/or 622, the temperatures of the components are sensed again at step 604. In addition, the steps following step 604 may be repeated for an indefinite period of time so long as the cooling system 402 is in operation.

It should be appreciated that the Tc's of some of the heat generating components may fall below the Tmin,set, whereas the Tc's of other ones of the heat generating components may exceed the Tmax,set. Thus, steps 610 and 612 may be respectively and substantially simultaneously performed on the various heat generating components.

By virtue of certain aspects of the present invention, the amount of energy, and thus the costs associated with cooling heat generating components of an electronic system, may be substantially reduced. In one respect, by operating the blowers of a cooling system to supply cooling fluid substantially only as needed by the heat generating components, the cooling system may be operated at a relatively more efficient manner as compared to conventional cooling systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. An electronic system comprising:
    a plurality of heat generating components; and
    a cooling system configured to supply cooling fluid to the plurality of heat generating components, said cooling system comprising:
        a variable speed blower;
        a plenum having an inlet and a plurality of outlets, wherein said inlet of said plenum is in fluid communication with said blower;
        a plurality of nozzles, said plurality of nozzles having a first end and a second end, each of said first ends of said nozzles being connected to said plurality of outlets of said plenum and each of said second ends of said nozzles terminating at a location with respect to respective ones of the plurality of heat generating components such that the plurality of heat generating components are within respective impinging zones of the cooling fluid flowing out of the plurality of nozzles; and
        a valve located at a position along each of said nozzles to independently vary a flow of said cooling fluid through each of said nozzles to provide substantially independent amounts of cooling fluid to the plurality of heat generating components.

2. The system according to claim 1, further comprising:
a plurality of valve controllers, said plurality of valve controllers being connected to at least one of said valves, wherein said plurality of valve controllers are operable to independently control each of said valves to thereby control the flow of the cooling fluid through each of said nozzles.

3. The system according to claim 2, further comprising:
a plurality of temperature sensors, said plurality of temperature sensors being configured to measure the temperatures of the plurality of heat generating components, wherein said valve controllers are configured to independently control each of said valves in response to said measured temperatures of the plurality of heat generating components.

4. The system according to claim 2, wherein each of said valve controllers is operable to independently control each of said valves based upon anticipated amounts of heat predicted to be generated by the plurality of heat generating components.

5. The system according to claim 2, further comprising:
a blower controller operable to control the speed of said blower, wherein said blower controller is operable to vary an output of the cooling fluid from said blower in response to signals received from said plurality of valve controllers to thereby vary the cooling fluid supply in said plenum.

6. The system according to claim 1, wherein said plenum includes a divider, said divider positioned to divide said plenum into a first chamber and a second chamber.

7. The system according to claim 6, wherein said first chamber is in fluid communication with said blower and said second chamber is in fluid communication with said nozzles, and wherein said divider operates to maintain a pressure of the cooling fluid in said second chamber at a substantially uniform pressure.

8. The system according to claim 1, wherein said valves comprise pulsating valves.

9. A rack system for housing a plurality of heat generating components, said rack system-comprising:
an enclosure having at least one side wall, said at least one side wall having a plenum including a divider separating said plenum into a first chamber and a second chamber, said second chamber comprising a plurality of outlets for discharging a cooling fluid into a space inside the enclosure;
at least one variable speed blower configured to supply the cooling fluid into said plenum;
a plurality of nozzles having a first end in fluid communication with each of said plurality of outlets and a second end extending into the space of the enclosure; and
a plurality of valves, each of said valves being operable to vary the flow of the cooling fluid through each of said nozzles.

10. The rack system according to claim 9, further comprising:
a plurality of valve controllers, each of said valve controllers being connected to at least one of said valves, wherein said plurality of valve controllers are operable to independently control each of said valves to thereby control the flow of the cooling fluid through each of said nozzles; and a blower controller operable to control the speed of said blower, wherein said blower controller is operable to vary the output of the cooling fluid from said blower in response to signals received from said plurality of valve controllers to thereby vary the cooling fluid supply in said plenum.

11. The rack system according to claim 9, comprising:
a plurality of heat generating components housed in the enclosure and selected from the group consisting of processors, micro-controllers, high speed video cards, disk drives, semi-conductor devices, and combinations thereof.

12. The rack system according to claim 11, further comprising:
a plurality of temperature sensors, said plurality of temperature sensors being configured to measure the temperatures of the plurality of heat generating components, wherein said valve controllers are configured to independently control each of said valves in response to said measured temperatures of the plurality of heat generating components.

13. The rack system according to claim 11, wherein each of said valve controllers is operable to independently control each of said valves based upon anticipated amounts of heat predicted to be generated by the plurality of heat generating components.

14. The rack system according to claim 9, wherein the first chamber is in fluid communication with the blower and the second chamber is in fluid communication with the plurality of nozzles, and wherein the divider operates to maintain a pressure of the cooling fluid in the second chamber at a substantially uniform pressure.

15. An electronic device comprising:
means for generating heat; and
means for cooling the plurality of heat generating means, said means for cooling comprising:
means for variably supplying a plenum with cooling fluid;
means for delivering the cooling fluid from the plenum to the means for generating heat, said means for delivering comprising a nozzle that terminates at a location with respect to the means for generating heat such that the means for generating heat is within an impinging zone of the cooling fluid flowing out of the nozzle; and
means for varying the cooling fluid flow through the means for delivering.

16. The electronic device according to claim 15, further comprising:
means for controlling the means for varying the cooling fluid flow through the means for delivering.

17. The electronic device according to claim 16, further comprising:
means for detecting the temperatures of the plurality of heat generating means, said means for controlling the means for varying the cooling fluid flow being configured to vary the cooling fluid flow through the means for delivering in response to the temperatures detected by the means for detecting.

18. The electronic device according to claim 15, further comprising:
means for dividing the plenum into a first chamber and a second chamber.

19. The electronic device according to claim 18, wherein the means for dividing the plenum operates to maintain a pressure of the cooling fluid in the second chamber at a substantially uniform pressure.

20. The electronic device according to claim 15, further comprising:

means for controlling the means for variably supplying the cooling fluid, the means for controlling the means for variably supplying the cooling fluid being operable to vary the supply of cooling fluid into the plenum in response to the cooling fluid flow through the means for delivering.

\* \* \* \* \*